United States Patent
Reese et al.

(10) Patent No.: US 9,870,652 B2
(45) Date of Patent: *Jan. 16, 2018

(54) VEHICLE BATTERY DATA ANALYSIS SERVICE

(71) Applicant: AT&T Intellectual Property I, L.P., Atlanta, GA (US)

(72) Inventors: Kevin Reese, Fayetteville, GA (US); Alfonso Jones, Irving, TX (US); Carl Sorrells, San Antonio, TX (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/350,545

(22) Filed: Nov. 14, 2016

(65) Prior Publication Data

US 2017/0061711 A1    Mar. 2, 2017

Related U.S. Application Data

(63) Continuation of application No. 14/454,466, filed on Aug. 7, 2014, now Pat. No. 9,493,074.

(51) Int. Cl.
*G07C 5/08*    (2006.01)
*B60L 3/12*    (2006.01)
(Continued)

(52) U.S. Cl.
CPC .............. *G07C 5/0808* (2013.01); *B60L 3/12* (2013.01); *B60L 11/1857* (2013.01);
(Continued)

(58) Field of Classification Search
CPC ....... G07C 5/0808; G07C 5/0841; B60L 3/12; B60L 11/1857; G01R 31/007;
(Continued)

(56) References Cited

U.S. PATENT DOCUMENTS 3,283,165 A * 11/1966 Bloch ...................... H02J 9/08
                                                                290/30 R
5,198,698 A *  3/1993 Paul ........................ H02J 9/08
                                                                307/46

(Continued)

FOREIGN PATENT DOCUMENTS

KR         20130008701          1/2013

OTHER PUBLICATIONS

Zhang et al., "Remote Vehicle State of Health Monitoring and Its Application to Vehicle No-Start Prediction," *AUTOTESTCON*, 2009 IEEE, IEEE, 2009.

(Continued)

*Primary Examiner* — Yonel Beaulieu
*Assistant Examiner* — Angelina Shudy
(74) *Attorney, Agent, or Firm* — Hartman & Citrin LLC

(57) ABSTRACT

Concepts and technologies are disclosed herein for a vehicle battery data analysis service. A processor can execute a vehicle battery data analysis service. The processor can generate a request to execute a load test at a vehicle and transmit the load request to a vehicle diagnostic system located at the vehicle. The processor can obtain diagnostic data generated by the vehicle diagnostic system. The diagnostic data can include test data that indicates a load of a battery of the vehicle and vehicle data that identifies the vehicle. The processor can update fleet data based upon the diagnostic data.

20 Claims, 7 Drawing Sheets

(51) Int. Cl.
  *B60L 11/18* (2006.01)
  *G01R 31/36* (2006.01)
  *G01R 31/00* (2006.01)

(52) U.S. Cl.
  CPC ....... *G01R 31/007* (2013.01); *G01R 31/3631* (2013.01); *G07C 5/0841* (2013.01); *G01R 31/3679* (2013.01); *G01R 31/3689* (2013.01); *Y02T 10/7005* (2013.01)

(58) Field of Classification Search
  CPC ............ G01R 31/3631; G01R 31/3679; G01R 31/3689; Y02T 10/7005
  USPC .......................................................... 701/28
  See application file for complete search history.

(56) References Cited

U.S. PATENT DOCUMENTS

| | | | |
|---|---|---|---|
| 5,939,861 A | 8/1999 | Joko | |
| 5,995,898 A | 11/1999 | Tuttle | |
| 6,331,762 B1 | 12/2001 | Bertness | |
| 6,532,482 B1 | 3/2003 | Toyosato | |
| 7,061,246 B2 | 6/2006 | Dougherty et al. | |
| 7,149,530 B1 | 12/2006 | Arakawa | |
| 7,652,448 B2 | 1/2010 | Palladino | |
| 7,750,639 B2* | 7/2010 | Quint | G01R 31/3648 324/426 |
| 8,111,037 B2 | 2/2012 | Zhang et al. | |
| 8,224,597 B2 | 7/2012 | Lesesky et al. | |
| 8,374,745 B2 | 2/2013 | Zhang et al. | |
| 8,618,928 B2 | 12/2013 | Weed | |
| 8,704,483 B2 | 4/2014 | Bertness et al. | |
| 9,043,086 B1* | 5/2015 | Gauthier | B60L 11/123 701/36 |
| 9,493,074 B2* | 11/2016 | Reese | B60L 3/12 |
| 2002/0026252 A1 | 2/2002 | Wruck et al. | |
| 2003/0210014 A1 | 11/2003 | Jabaji | |
| 2003/0224833 A1* | 12/2003 | Egan | H02P 9/30 455/572 |
| 2004/0174018 A1* | 9/2004 | Itoh | B60W 10/26 290/40 C |
| 2005/0182536 A1 | 8/2005 | Doyle et al. | |
| 2006/0031035 A1 | 2/2006 | Brott | |
| 2006/0033473 A1 | 2/2006 | Stanzel | |
| 2006/0244423 A1* | 11/2006 | Henningson | G01R 31/3631 320/150 |
| 2006/0244456 A1* | 11/2006 | Henningson | G01R 31/007 324/378 |
| 2006/0244457 A1* | 11/2006 | Henningson | G01R 31/006 324/426 |
| 2006/0284619 A1* | 12/2006 | Quint | G01R 31/3648 324/433 |
| 2007/0239374 A1* | 10/2007 | Dougherty | G01R 31/36 702/63 |
| 2007/0244660 A1 | 10/2007 | Bertness | |
| 2007/0262750 A1* | 11/2007 | Yun | G01R 31/3675 320/132 |
| 2008/0224710 A1* | 9/2008 | Henningson | G01R 19/16542 324/433 |
| 2009/0241651 A1* | 10/2009 | Ehlers | G01R 31/007 73/114.58 |
| 2009/0281928 A1* | 11/2009 | Quint | G06Q 10/087 705/28 |
| 2010/0201191 A1* | 8/2010 | Schick | B60R 16/03 307/10.1 |
| 2011/0046842 A1* | 2/2011 | Smith | G07C 5/006 701/31.4 |
| 2011/0082621 A1 | 4/2011 | Berkobin et al. | |
| 2012/0158245 A1* | 6/2012 | Yoshizawa | B60R 16/03 701/36 |
| 2012/0182132 A1 | 7/2012 | McShane | |
| 2012/0303230 A1* | 11/2012 | Qiao | G01N 33/2888 701/59 |
| 2013/0021174 A1 | 1/2013 | Silzer, Sr. | |
| 2014/0129163 A1 | 5/2014 | Betzner | |
| 2014/0375276 A1 | 12/2014 | Zeier | |
| 2015/0202977 A1* | 7/2015 | McCall | B60L 3/12 701/22 |
| 2016/0039291 A1* | 2/2016 | Reese | B60L 3/12 701/29.3 |
| 2016/0104123 A1* | 4/2016 | Viswanath | G06F 17/30424 705/305 |
| 2017/0024937 A1* | 1/2017 | Ramesh | G07C 5/0816 |
| 2017/0039668 A1* | 2/2017 | Luke | B60L 11/1861 |
| 2017/0061711 A1* | 3/2017 | Reese | B60L 3/12 |

OTHER PUBLICATIONS

U.S. Office Action dated Feb. 24, 2016 in U.S. Appl. No. 14/454,466.
U.S. Notice of Allowance dated Jun. 29, 2016 in U.S. Appl. No. 14/454,466.

* cited by examiner

VEHICLE BATTERY DATA ANALYSIS SERVICE

CROSS-REFERENCE TO RELATED APPLICATIONS

This application is a continuation of and claims priority to U.S. patent application Ser. No. 14/454,466, entitled "Vehicle Battery Data Analysis Service," filed Aug. 7, 2014, now U.S. Pat. No. 9,493,074, which is incorporated herein by reference in its entirety.

BACKGROUND

Many companies or other entities maintain fleets of vehicles for various reasons. For example, a taxi company may maintain fleets of vehicles for use as taxis. Maintenance of fleet vehicles can be expensive and time consuming. Furthermore, when a vehicle is being repaired or maintained, the vehicle cannot be used as part of the fleet. Thus, many companies that maintain a fleet of vehicles attempt to limit repairs of vehicles to planned maintenance to reduce lost time and/or costs.

Fleet vehicles are often run for many hours a day and may be subjected to extreme operating conditions. For example, users may leave the vehicles running for most of the day to maintain a comfortable temperature inside of the vehicle. Thus, a vehicle may run for ten to twelve hours per day or be subjected to other operating conditions that may shorten the life of the vehicle and/or components thereof.

The batteries of vehicles are generally replaced on a regular schedule to prevent failures in the field. If a battery fails in the field, the vehicle may be immobile and stuck at a particular location. Thus, a tow service or other entity may be called to start the vehicle and/or otherwise allow the vehicle to be moved. These types of calls can take hours and therefore can seriously impact a fleet that includes the vehicle. To address this possibility, some fleet management entities may regularly repair or replace batteries. Batteries for vehicles can be expensive, however, so unnecessarily replacing batteries can reduce profits of a company.

On the other hand, not replacing a battery of a vehicle can pose other problems. If a battery fails in the field, the vehicle may be stuck for a portion of the day or even for multiple days. At that point, costs of losing use of the vehicle, lost productivity of an operator of the vehicle, and out-of-pocket expenses to tow or otherwise repair the vehicle can be more expensive than an unnecessary battery replacement. As such, some fleet operators may regularly replace batteries that do not require replacement. This can negatively impact business profitability, but the costs of not doing so may be too great to offset this risk.

SUMMARY

The present disclosure is directed to a vehicle battery data analysis service. The vehicle battery data analysis service can be configured to obtain diagnostic data from a vehicle diagnostic system or other device associated with a vehicle. The diagnostic data can include, among other things, test data that can represent or can be analyzed to determine, health of a vehicle battery associated with the vehicle. The diagnostic data also can include environmental data that can correspond to an ambient environment at the vehicle or a location at which the vehicle is located. The diagnostic data also can include vehicle data that can identify the vehicle and/or location data that can identify a geographic location at which the vehicle is located.

According to various embodiments, the vehicle diagnostic system can obtain the test data from a load tester located at the vehicle and in communication with the battery. The load tester can be external to the battery, within the battery, and/or attached to the battery. The load tester can include circuitry that can include a relay or other device for connecting or disconnecting part of a circuit. In one contemplated embodiment, the load tester can include a relay in a circuit between the battery and the alternator. When the relay is activated, the alternator or at least one electrical connection thereto can be isolated from the circuit and a load sensor can be added to the circuit. As such, a load test can be performed on the battery at any time, including when the vehicle is running. If the vehicle is not running, activation of the relay can be omitted as the alternator does not generate a current when the vehicle is not running.

During a load test, the load sensor can detect a load such as a current or voltage within the circuit and/or at the battery, and provide the sensed load to a data output of the load tester. The data output also can receive a battery identifier, in some embodiments. The battery identifier can be obtained by the load tester using various technologies such as radio frequency identification or the like. The battery identification and the detected load can be output by the data output as the test data and provided to the vehicle diagnostic system or vehicle computing system or intelligent vehicle device ("IVD").

The vehicle diagnostic system can execute a diagnostics application, in some embodiments. The vehicle diagnostic system can package the test data and/or other information obtained from various vehicle sensors such as thermometers, hygrometers, barometers, speedometers, location devices, combinations thereof, or the like, and provide the information to the vehicle battery data analysis service as the diagnostic data. The vehicle battery data analysis service can analyze the diagnostic data and create or update fleet data for the vehicle and/or other vehicles.

The vehicle battery data analysis service can analyze the fleet data to detect battery performance trends based upon ambient conditions, battery details such as age and history, geographic locations, combinations thereof, or the like. The vehicle battery data analysis service can use the analysis to determine if and/or when the battery is expected to fail. The vehicle battery data analysis service can generate a report detailing the battery health and/or life expectancy. In some embodiments, the vehicle battery data analysis service may only generate the report if failure of the battery is imminent. In either event, the report can be provided to a fleet management entity, and the fleet management entity can take various steps to address a pending or possible failure such as ordering repairs, or the like. Thus, embodiments of the concepts and technologies described herein can be used to help prevent in-field failures of batteries, which may be expensive and time consuming when they occur.

According to one aspect of the concepts and technologies disclosed herein, a method is disclosed. The method can include generating, at a processor executing a vehicle battery data analysis service, a request to execute a load test at a vehicle. The method also can include transmitting, by the processor, the load request to a vehicle diagnostic system located at the vehicle, and obtaining, by the processor, diagnostic data generated by the vehicle diagnostic system. The diagnostic data can include test data that indicates a load of a battery of the vehicle and vehicle data that identifies the vehicle. The method also can include updating, by the processor, fleet data based upon the diagnostic data.

In some embodiments, the method also can include determining that failure of the battery is imminent based upon an analysis of the fleet data and the diagnostic data, and transmitting, to a fleet management entity, a report that indicates that the failure is imminent. In some embodiments, the diagnostic data further can include location data that identifies a geographic location at which the vehicle can be located, and environmental data that identifies ambient conditions at the location. The test data can be obtained by the vehicle diagnostic system from a load tester in communication with the vehicle diagnostic system. The load tester can be located at the vehicle.

According to some embodiments, the load tester can include a relay that, when activated, disconnects a vehicle alternator from the battery and connects a load sensor to the battery. The load sensor can measure a load of the battery and provides a signal indicating the load measured to a data output. In some embodiments, the load tester can include a receiver that can obtain a battery identifier from the battery, and can provide the battery identifier to a data output that can obtain a load from a load sensor. In some embodiments, the receiver can include a radio frequency identification receiver, and the battery can include a further radio frequency identification transmitter.

According to some embodiments, the method also can include in response to determining that failure of the battery is imminent based upon an analysis of the fleet data and the diagnostic data, transmitting, to a fleet management entity, a report that indicates that the failure is imminent. The fleet management entity can order a repair of the battery and can indicate, to the vehicle diagnostic system, that the battery is expected to fail. In some embodiments, the test data can be obtained by the vehicle diagnostic system from a load tester in communication with the vehicle diagnostic system. The vehicle diagnostic system can activate a relay included in the load tester to disconnect a vehicle alternator from the battery and to connect a load sensor to the battery in response to determining that the vehicle is running. In some embodiments, obtaining the diagnostic data can include obtaining diagnostic data generated by the vehicle diagnostic system while the vehicle is running.

According to another aspect of the concepts and technologies disclosed herein, a system is disclosed. The system can include a processor and a memory. The memory can store computer-executable instructions that, when executed by the processor, cause the processor to perform operations. The operations can include generating a request to execute a load test at a vehicle, transmitting the load request to a vehicle diagnostic system located at the vehicle, and obtaining diagnostic data generated by the vehicle diagnostic system. The diagnostic data can include test data that indicates a load of a battery of the vehicle and vehicle data that identifies the vehicle. The operations further can include updating fleet data based upon the diagnostic data.

In some embodiments, the computer-executable instructions, when executed by the processor, can cause the processor to perform operations further including determining that failure of the battery is imminent based upon an analysis of the fleet data and the diagnostic data, and transmitting, to a fleet management entity, a report that indicates that the failure is imminent. In some embodiments, the load tester can include a relay that, when activated, disconnects a vehicle alternator from the battery and connects a load sensor to the battery. The load sensor can measure a load from the battery and can provide the load to the vehicle diagnostic system as part of the test data.

In some embodiments, the computer-executable instructions, when executed by the processor, can cause the processor to perform operations further including in response to determining that failure of the battery is imminent based upon an analysis of the fleet data and the diagnostic data, transmitting, to a fleet management entity, a report that indicates that the failure is imminent, wherein the fleet management entity orders a repair of the battery and indicates, to the vehicle diagnostic system, that the battery is expected to fail. In some embodiments, the test data can be obtained by the vehicle diagnostic system from a load tester in communication with the vehicle diagnostic system. The vehicle diagnostic system can activate a relay included in the load tester to disconnect a vehicle alternator from the battery and to connect a load sensor to the battery in response to determining that the vehicle is running.

According to yet another aspect of the concepts and technologies disclosed herein, a computer storage medium is disclosed. The computer storage medium can have computer-executable instructions stored thereon. When the instructions are executed by a processor, the processor can perform operations including generating a request to execute a load test at a vehicle, transmitting the load request to a vehicle diagnostic system located at the vehicle, and obtaining diagnostic data generated by the vehicle diagnostic system. The diagnostic data can include test data that indicates a load of a battery of the vehicle and vehicle data that identifies the vehicle. The operations further can include updating fleet data based upon the diagnostic data.

In some embodiments, the computer-executable instructions, when executed by the processor, can cause the processor to perform operations further including determining that failure of the battery is imminent based upon an analysis of the fleet data and the diagnostic data, and transmitting, to a fleet management entity, a report that indicates that the failure is imminent. In some embodiments, the load tester can include a relay that, when activated, disconnects a vehicle alternator from the battery and connects a load sensor to the battery. The load sensor can measure a load from the battery and can provide the load to the vehicle diagnostic system as part of the test data.

In some embodiments, the test data can be obtained by the vehicle diagnostic system. The vehicle diagnostic system can obtain the test data from a load tester in communication with the vehicle diagnostic system. The vehicle diagnostic system can activate a relay included in the load tester to disconnect a vehicle alternator from the battery and to connect a load sensor to the battery in response to determining that the vehicle is running.

Other systems, methods, and/or computer program products according to embodiments will be or become apparent to one with skill in the art upon review of the following drawings and detailed description. It is intended that all such additional systems, methods, and/or computer program products be included within this description, be within the scope of this disclosure.

DETAILED DESCRIPTION

Figure 1:
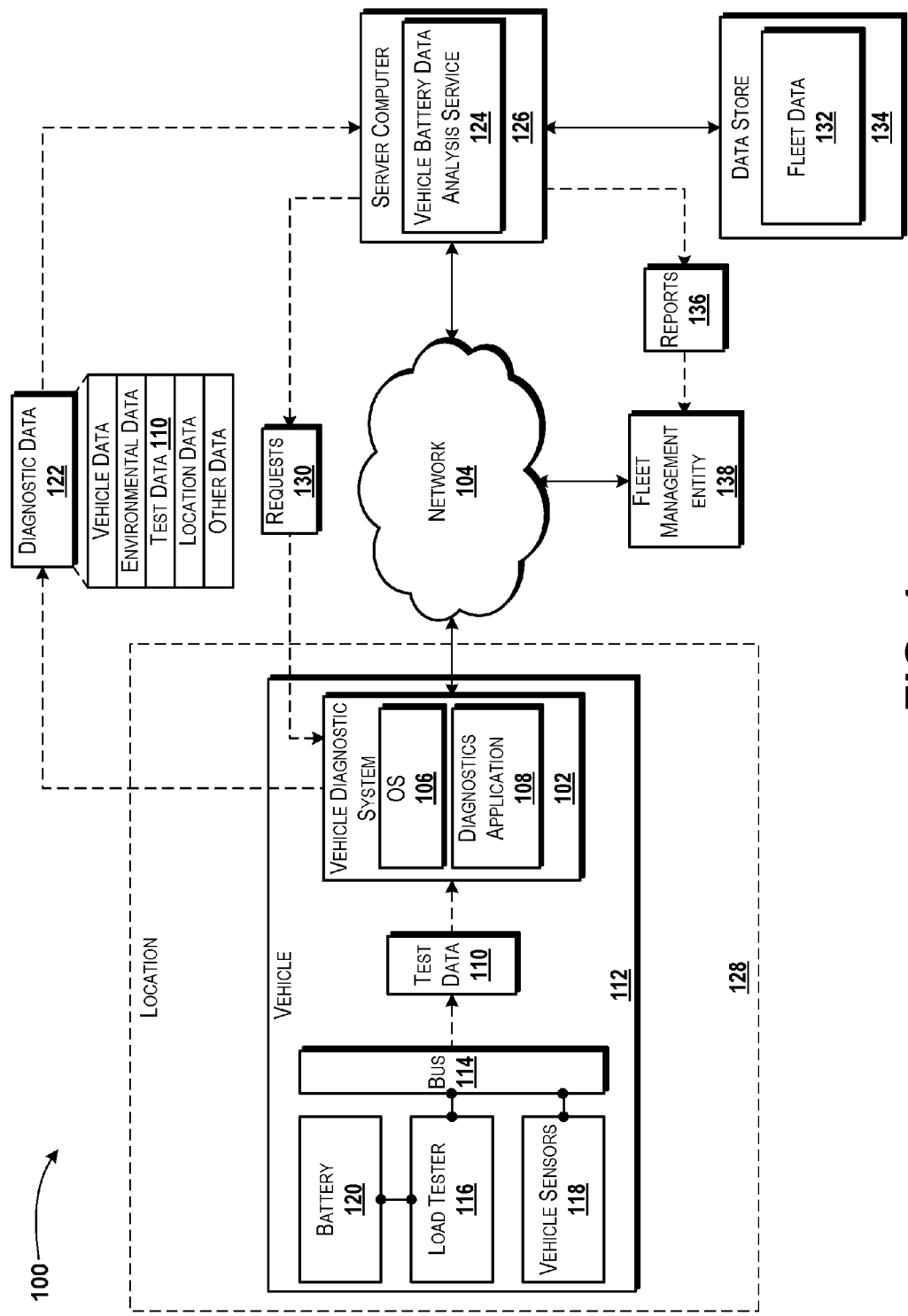
FIG. 1 is a system diagram illustrating an illustrative operating environment for various embodiments of the concepts and technologies described herein, according to an illustrative embodiment.

The following detailed description is directed to a vehicle battery data analysis service. The vehicle battery data analysis service can be an application, module, or other service executed by a server computer or other computing device. The vehicle battery data analysis service can be configured to obtain diagnostic data from a vehicle diagnostic system or other device associated with a vehicle. The diagnostic data can include test data that can represent or can be analyzed to determine, health of a vehicle battery associated with the vehicle, environmental data, location data, other data, or the like. The diagnostic data also can include vehicle data that can identify the vehicle and/or location data that can identify a geographic location at which the vehicle is located.

The vehicle diagnostic system can obtain the test data from a load tester located at the vehicle and in communication with the battery. The load tester can be external to the battery, within the battery, or attached to the battery. The load tester can include circuitry for connecting or disconnecting part of a circuit isolate an alternator from a battery, in some embodiments. As such, a load test can be performed on the battery at any time, including when the vehicle is running. During a load test, the load sensor can detect a load such as a current or voltage within the circuit and/or at the battery, and provide the sensed load to a data output of the load tester. The data output also can receive a battery identifier, in some embodiments. The battery identifier and the detected load can be output by the data output as the test data and provided to the vehicle diagnostic system.

The vehicle diagnostic system can package the test data and/or other information obtained from various vehicle sensors and provide the information to the vehicle battery data analysis service as the diagnostic data. The vehicle battery data analysis service can analyze the diagnostic data and create or update fleet data for the vehicle and/or other vehicles. The vehicle battery data analysis service can determine if and/or when the battery is expected to fail. The vehicle battery data analysis service can generate a report detailing the battery health and/or life expectancy and, provide the report to a fleet management entity.

The vehicle battery data analysis service can analyze the fleet data to detect battery performance trends based upon ambient conditions, battery details such as age and history, geographic locations, combinations thereof, or the like. The vehicle battery data analysis service can use the analysis to determine if and/or when the battery is expected to fail. The vehicle battery data analysis service also can generate a report detailing the battery health and/or life expectancy and provide the report to a fleet management entity. In addition to determining overall battery health and/or life expectancy, the concepts and technologies described herein can be used to identify and/or determine one or more battery cells that are weak or otherwise not performing ideally. In some embodiments, the load tester can replicate the load of a vehicle starter system while the vehicle is running to identify a poorly performing battery and/or weak cells.

While the subject matter described herein is presented in the general context of program modules that execute in conjunction with the execution of an operating system and application programs on a computer system, those skilled in the art will recognize that other implementations may be performed in combination with other types of program modules. Generally, program modules include routines, programs, components, data structures, and other types of structures that perform particular tasks or implement particular abstract data types. Moreover, those skilled in the art will appreciate that the subject matter described herein may be practiced with other computer system configurations, including hand-held devices, multiprocessor systems, microprocessor-based or programmable consumer electronics, minicomputers, mainframe computers, and the like.

Referring now to FIG. 1, aspects of an operating environment 100 for various embodiments of the concepts and technologies disclosed herein for vehicle battery data analysis service will be described, according to an illustrative embodiment. The operating environment 100 shown in FIG. 1 includes a vehicle diagnostic system 102 operating in communication with and/or as part of a communications network ("network") 104.

According to various embodiments, the functionality of the vehicle diagnostic system 102 may be provided by one or more test devices, mobile telephones, laptop computers, embedded computing systems, vehicle computing devices or computing systems, vehicle control systems, vehicle information systems, other computing systems, combinations thereof, or the like. It should be understood that the functionality of the vehicle diagnostic system 102 can be provided by a single device, by two similar devices, and/or by two or more dissimilar devices. For purposes of describing the concepts and technologies disclosed herein, the vehicle diagnostic system 102 is described herein as a vehicle computing system. It should be understood that this embodiment is illustrative, and should not be construed as being limiting in any way.

The vehicle diagnostic system 102 can execute an operating system 106 and one or more application programs such as, for example, a diagnostics application 108. The operating system 106 is a computer program for controlling the operation of the vehicle diagnostic system 102. The diagnostics application 108 is an executable program configured to execute on top of the operating system 106 to provide various functions illustrated and described herein for providing or interacting with a vehicle battery data analysis service.

In particular, as will be explained in additional detail below, the diagnostics application 108 can be configured to collect test data 110 at a vehicle 112. According to various embodiments, the test data 110 can be collected via a bus 114. The bus 114 can provide a connection via which the vehicle diagnostic system 102 can collect the test data 110, in some embodiments. It should be understood that the bus 114 is optional and can be omitted from some embodiments of the concepts and technologies described herein.

According to various embodiments, the test data 110 can be collected from a load tester 116 and one or more vehicle sensors 118. The structure and functionality of the load tester 116 will be illustrated and described in more detail below, particularly with reference to FIG. 2. Briefly, the load tester 116 can be in electrical communication with a battery 120 and can generate information that represents the electrical health and/or status of the battery 120. This information can be provided to the vehicle diagnostic system 102 as part of the test data 110 and can be used for various purposes described in further detail herein. Additional details of the load tester 116 are illustrated and described in more detail below, particularly with reference to FIG. 2.

The vehicle sensors 118 can include various sensors, sensor arrays, information systems, and the like. Data, information, and/or signals from the vehicle sensors 118 can be provided to the vehicle diagnostic system 102 as part of the test data 110. As noted above, the use of the test data 110 will be further described in more detail below. Briefly, however, it should be understood that the vehicle sensors 118 can include various sources of signals and/or data such as, for example, vehicle navigation systems and/or devices, thermometers, voltage gauges, ignition sensors, vehicle temperature gauges, speedometers, vehicle pressure gauges, ambient condition monitors (e.g., hygrometers, thermometers, barometers, etc.), altimeters, tire pressure gauges, combinations thereof, or the like. These and other vehicle sensors 118 can be used to generate signals and/or data included in the test data 110, and the test data 110 can be used for various purposes as illustrated and described herein.

The diagnostics application 108 can be configured to obtain the test data 110 and package the test data 110 with other data obtained at the vehicle 112. According to various embodiments, the diagnostics application 108 can package the data as diagnostic data 122 and provide the diagnostic data 122 to a vehicle battery data analysis service 124. The vehicle battery data analysis service 124 can be an application executed and/or hosted by a computing device such as a desktop computer or sever computer. In the illustrated embodiment, the vehicle battery data analysis service 124 can be a callable service hosted by a server computer 126. It should be understood that this example is illustrative and therefore should not be construed as being limiting in any way.

The vehicle battery data analysis service 124 can obtain the diagnostic data 122 and perform various operations on the diagnostic data 122 as illustrated and described herein. According to various embodiments, the diagnostic data 122 can include, but is not limited to, vehicle data, environmental data, the test data 110 and/or one or more portions thereof, location data, and other data. The vehicle data can identify a vehicle 112, a vehicle diagnostic system 102 associated with the vehicle 112, a user associated with a vehicle 112, a battery 120 associated with a vehicle 112, and/or other data that can be used to identify a particular battery 120 and/or a particular vehicle 112. As such, the vehicle data portion of the diagnostic data 122 can be used to relate other portions of the diagnostic data 122 with a particular user, vehicle 112, account, operator, battery 120, or the like.

According to various embodiments of the concepts and technologies described herein, the vehicle data can include a vehicle identification number ("VIN"); an operator name, userID, employee number, or other identifier; other vehicle identification information such as a vehicle name, number, or the like; an identifier associated with the vehicle diagnostic system 102 or other device such as an Internet Protocol ("IP") address, a media access control ("MAC") address, an international mobile equipment identity ("IMEI"), an international mobile subscriber identity ("IMSI"), or other device identifier; combinations thereof; or the like. Because the vehicle 112 and/or a user associated with the vehicle 112 can be identified in additional and/or alternative manners, it should be understood that these examples are illustrative and therefore should not be construed as being limiting in any way.

The environmental data can reflect an environment associated with a location 128 at which the vehicle 112 is located. The environmental data can reflect, for example, a temperature, air pressure, humidity, or the like associated with the location 128. It can be appreciated that the location 128 can correspond to an ambient environment at or around the vehicle 112, and as such, the location 128 can move with the vehicle 112. Thus, while the location 128 may correspond to a geographic location at a particular time, the location 128 can change based upon movements of the vehicle 112.

The test data 110 is illustrated and described above and therefore is not illustrated and described in additional detail here. It can be appreciated, however, that one or more portions of the test data 110 obtained by the vehicle diagnostic system 102 can be included in the diagnostic data 122, while some other portions of the test data 110 can be omitted from the diagnostic data 122. It should be understood that this example is illustrative and therefore should not be construed as being limiting in any way.

The location data can reflect a location of the vehicle 112 and/or the location 128. The location data can be used to correlate one or more portions of the diagnostic data 122 with a particular location or environment such as the location 128. According to various embodiments, the vehicle data can be obtained from the vehicle 112. For example, the vehicle 112 can include a navigation system and/or global positioning system ("GPS") receiver that can determine a geographic location at which the vehicle 112 is located. In some other embodiments, the vehicle diagnostic system 102 can include or communicate with a location device or system to determine a location at which the vehicle 112 is located. Regardless of how the location of the vehicle 112 is determined, the location can be represented by location data included in the diagnostic data 122, if desired. It should be understood that this example is illustrative and therefore should not be construed as being limiting in any way.

The other data can include other information that can be used by the vehicle battery data analysis service 124 as illustrated and described herein. For example, the other data can reflect vehicle or user profiles (e.g., vehicle models, account data, or the like); trends or history information associated with the vehicle 112, a user thereof, or other entities; time information associated with the test data 110 and/or the diagnostic data 122; combinations thereof, or the like. Because the other data can include any other information used by the vehicle battery data analysis service 124 as illustrated and described herein, it should be understood that these examples are illustrative and therefore should not be construed as being limiting in any way.

The vehicle battery data analysis service 124 can be configured to obtain the diagnostic data 122 and use the diagnostic data 122 for various purposes as will be illustrated and described in more detail below. The vehicle battery data analysis service 124 can obtain the diagnostic data 122 in response to a request 130, in some embodiments. Via the request 130, the vehicle battery data analysis service 124 can query the vehicle 112 and/or a vehicle diagnostic system 102 for the diagnostic data 122. Thus, the vehicle battery data analysis service 124 can be configured to obtain the diagnostic data 122 via requests 130 in some embodiments. It should be understood that this example is illustrative and therefore should not be construed as being limiting in any way.

In some other embodiments, the vehicle battery data analysis service 124 can receive the diagnostic data 122 without a request. For example, the vehicle diagnostic system 102 can be configured to periodically generate and transmit the diagnostic data 122 to the vehicle battery data analysis service 124. In some other embodiments, the vehicle diagnostic system 102 can be configured to provide the diagnostic data 122 to the vehicle battery data analysis service 124 when the diagnostic data 122 and/or the test data 110 changes or is obtained by the vehicle diagnostic system 102. Because the diagnostic data 122 can be provided to the vehicle battery data analysis service 124 at additional and/or alternative times, it should be understood that these examples are illustrative and therefore should not be construed as being limiting in any way.

The vehicle battery data analysis service 124 can be configured to analyze the diagnostic data 122 to determine how a battery 120 associated with a particular vehicle 112 is performing. The vehicle battery data analysis service 124 also can be configured to determine, based upon the diagnostic data 122, an anticipated battery life associated with the battery 120. The anticipated battery life can be used by the vehicle battery data analysis service 124 to attempt to avoid in-field failures of the battery 120 associated with a particular vehicle 112. Thus, embodiments of the concepts and technologies described herein can be used to reduce costs associated with vehicle 112 or a fleet of vehicles by preventing in-field failures of the battery 120.

The vehicle battery data analysis service 124 also can be configured to generate and/or maintain fleet data 132. The fleet data 132 can be stored at a data storage device such as a data store 134. The functionality of the data store 134 can be provided by one or more databases, server computers, desktop computers, mobile telephones, laptop computers, other computing systems, and the like. In the illustrated embodiments, the functionality of the data store 134 can be provided by a database in communication with the server computer 126. It should be understood that this example is illustrative and therefore should not be construed as being limiting in any way.

The fleet data 132 can represent battery performance information associated with multiple vehicles of a vehicle fleet that can include the vehicle 112. By generating, maintaining, and/or analyzing the fleet data 132, the vehicle battery data analysis service 124 can track trends associated with battery performance based upon a variety of information such as location, ambient conditions, battery life, vehicle or user identifiers, battery information, combinations thereof, or the like.

According to various embodiments, the vehicle battery data analysis service 124 can analyze the fleet data 132 to identify a battery 120 that is nearing failure. Based upon this determination, the vehicle battery data analysis service 124 can generate a report 136 and transmit the report 136 to an entity associated with fleet management ("fleet management entity") 138. The fleet management entity 138 can include, for example, a computing device, an operator, an ordering system (for ordering a new battery and/or labor for replacing a battery with the new battery), combinations thereof, or the like. It should be understood that this example is illustrative and therefore should not be construed as being limiting in any way.

According to various embodiments, a vehicle 112 can be equipped with a load tester 116. The load tester 116 can be in electrical communication with a battery 120 of the vehicle 112. In some embodiments, as will be illustrated and described in more detail with reference to FIG. 2 below, the load tester 116 can include or can be coupled to hardware for isolating the battery 120 from other electrical systems of the vehicle 112 such as an alternator, generator, or the like. Thus, the load tester 116 can be used to test the battery 120 while the vehicle 112 is running and/or at other times.

The load tester 116 and/or various vehicle sensors 118 can provide test data 110 to a vehicle diagnostic system 102. In some embodiments, the test data 110 can be provided to the vehicle diagnostic system 102 via a bus 114, though this is not necessarily the case. The vehicle diagnostic system 102 can package the test data 110, for example as part of diagnostic data 122, and provide the diagnostic data 122 to a vehicle battery data analysis service 124.

The vehicle battery data analysis service 124 can analyze the diagnostic data 122 and generate or update fleet data 132. The vehicle battery data analysis service 124 can store the fleet data 132 at a data store 134. At various times, the vehicle battery data analysis service 124 can analyze the fleet data 132 to determine battery performance for a particular battery 120 and/or for batteries associated with one or more vehicles of a fleet that can include the vehicle 112. Based upon the analysis of the fleet data 132, the vehicle battery data analysis service 124 can generate one or more reports 136. The reports 136 can provide battery performance information, as well as predicted battery life and/or predicted failures. This information can be used by a fleet management entity 138 to minimize disruptions that can occur due to battery failures. These and other aspects of the concepts and technologies described herein will be illustrated and described herein with more detail, particularly with reference to FIGS. 2-4.

FIG. 1 illustrates one vehicle diagnostic system 102, one network 104, one vehicle 112, one server computer 126, one location 128, one data store 134, and one fleet management entity 138. It should be understood, however, that various implementations of the operating environment 100 can include zero, one, or more than one vehicle diagnostic system 102; zero, one, or more than one network 104; zero, one, or more than one vehicle 112; zero, one, or more than one server computer 126; zero, one, or more than one data store 134; and/or zero, one, or more than one fleet management entity 138. As such, the illustrated embodiment should be understood as being illustrative, and should not be construed as being limiting in any way.

Figure 2:
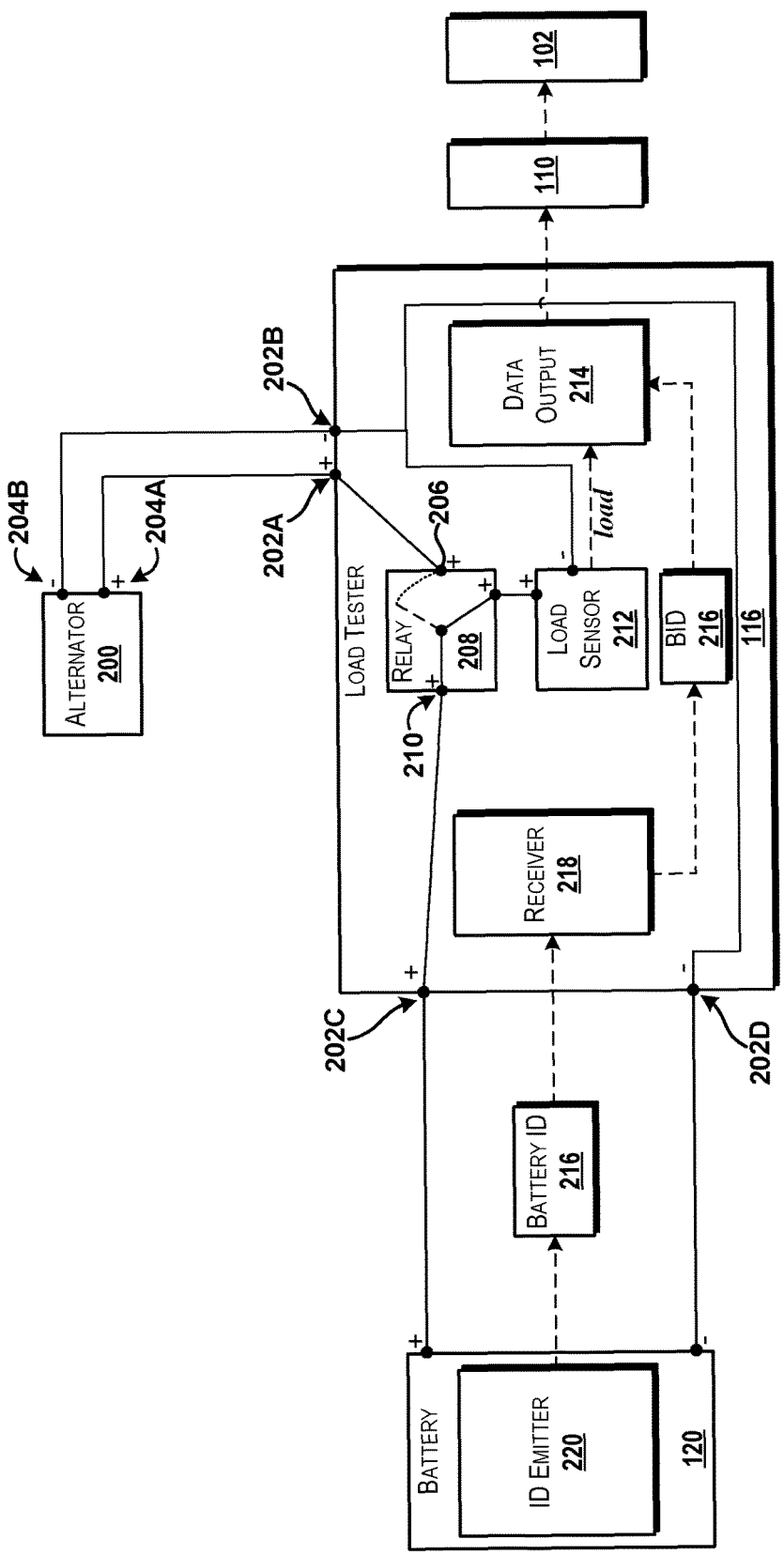
FIG. 2 is a line drawing schematically illustrating a load tester and various related components, according to some illustrative embodiments of the concepts and technologies described herein.

Turning now to FIG. 2, additional details of the concepts and technologies described herein for providing a vehicle battery data analysis system will be described in detail. In particular, FIG. 2 is a line drawing illustrating a load tester 116 and various other components that can communicate with the load tester 116, according to some illustrative embodiments of the concepts and technologies described herein.

As shown in FIG. 2, the load tester 116 can be in electrical communication with the battery 120 and an alternator, generator, or other electrical current creation device ("alternator") 200 of a vehicle such as the vehicle 112. As generally is understood, the alternator 200 can create an alternating current for use and/or consumption by various components of the vehicle 112. Thus, the battery 120 can be used to start the engine of the vehicle 112, while the alternator 200 can thereafter generate the current needed to support the various electrical systems and/or components of the vehicle 112. It should be understood that this example is illustrative and therefore should not be construed as being limiting in any way.

As shown in FIG. 2, the load tester 116 can have one or more pairs of electrical connections 202A-D (hereinafter collectively and/or generically referred to as "electrical connections 202"). In the illustrated embodiment, the load tester 116 can include a first positive electrical connection 202A, a first negative or neutral electrical connection 202B, a second positive electrical connection 202C, and a second negative or neutral electrical connection 202D. While the electrical connections 202 are shown as two pairs of electrical connections (202A-B and 202C-D) at two different locations on the load tester 116, it should be understood that the electrical connections 202 can be stacked or co-located in some embodiments, or can be located in other devices or structures such as a disconnect or other device. In the illustrated embodiment, the load tester 116 includes circuitry for providing a disconnect, as will be illustrated and described in more detail herein.

According to various embodiments, a positive electrical output connection 204A from the alternator 200 can be in electrical communication with a first positive electrical connection 202A of the load tester 116. The first positive electrical connection 202A can be connected to a relay input connector 206 of a relay 208. The relay 208 can include a relay connector 210 via which a positive current from the alternator 200 can be routed to the battery 120 to allow charging of the battery as is generally understood.

Via activation of the relay 208 (or deactivation thereof depending upon design), the relay 208 can disconnect or isolate the alternator 200 such that the current from the alternator 200 is isolated from the battery 120 and a load sensor 212 of the load tester 116. Thus, the load tester 116 can be configured to support testing of the battery 120 even when the vehicle 112 is running, if desired.

During a test of the battery 120 that occurs while the vehicle 112, and therefore the alternator 200, is running, the relay 208 can be activated to disconnect the alternator 200 from a sensor loop that includes the load sensor 212. Thus, the load sensor 212 can measure a current, voltage, or other electrical characteristic of the battery 120 at any time, even if the vehicle 112 is running. Upon deactivation of the relay 208 (or activation, depending upon design), the load sensor 212 can be isolated from the battery 120 and the alternator 200, thereby allowing normal operation of these components of the vehicle 112.

During activation of the relay 208 (or deactivation, depending upon design), the load sensor 212 can detect a current, voltage, or other electrical characteristic of the battery 120 (labeled as a "load"). The load sensor 212 can pass a signal or data relating to the load to a data output mechanism ("data output") 214. The data output 214 can, in turn, pass data indicating the load as the test data 110 illustrated and described herein with reference to FIG. 1.

According to various embodiments of the concepts and technologies described herein, the load sensor 212 can include hardware and/or software for emulating loads on the battery 120. In some embodiments, for example, the load sensor 212 and/or another part of the sensor loop that includes the load sensor 212, the relay 208, and excludes the alternator 200 can include an adjustable or variable resistance device, loop, or the like, such as a pot, a rheostat, or the like. Thus, the load sensor 212 and/or other hardware or software can be configured to adjust the resistance loop to simulate a load induced by the starter motor of the vehicle 112. The load of the starter motor can be modeled and represented by the resistance loop in various embodiments. Thus, some embodiments of the concepts and technologies described herein can be used to identify and/or determine one or more cells of the battery 120 (also referred to herein as "battery cells") that are weak or otherwise not performing ideally during operation of the vehicle 112.

It can be appreciated that by simulating a starter motor load on the battery 120 during operation of the vehicle 112, risk of a breakdown is limited or even eliminated. In particular, if the load tester 116 detects a bad battery 120 or failed battery cells, the load tester 116 can, after the test is complete, deactivate the relay 208 to add the alternator 200 back into connection with the battery 120. Thus, the alternator 200 can continue to charge the battery 120 and keep the vehicle 112 running. A warning can be generated for presentation to a vehicle operator and/or a fleet management entity 138. The warning can instruct the operator not to stop the vehicle 112 until he or she has returned the vehicle 112 to a desired location such as a parking lot, repair facility, garage, or the like associated with the fleet management entity 138.

Similarly, the warning to the fleet management entity 138 can inform the fleet management entity 138 of the needed repairs and/or enable the fleet management entity 138 to reassign duties associated with the vehicle 112 to other vehicles, identify a replacement vehicle for the operator, or the like. Because warnings and/or messages can be provided to additional and/or alternative entities, it should be understood that the above example is illustrative and therefore should not be construed as being limiting in any way.

In addition to obtaining the load from the load sensor 212, the data output 214 also can obtain a battery identifier 216. The battery identifier 216 (labeled in FIG. 2 as the "battery ID 216") can be obtained from a battery 120 or from a receiver 218 as shown in FIG. 2. In some embodiments, the battery 120 can include an identifier emitter or transmitter ("ID emitter") 220, which can emit data indicating the battery identifier 216. The emitted data can be received or recognized by the receiver 218 and then passed to the data output 214.

In one contemplated embodiment, the battery 120 can include a radio frequency identification ("RFID") tag that can be activated by the receiver 218 (in which case the receiver 218 can function as a transceiver). Thus, the data output 214 can obtain the vehicle data or other information identifying the battery 120 as illustrated and described above. It should be understood that this example is illustrative and therefore should not be construed as being limiting in any way.

It can be appreciated from FIG. 2 that the load sensor 212 can be removed from a circuit that includes the battery 120 and the alternator 200 if desired via manipulation of the relay 208. As such, the load tester 116 can be selectively activated or deactivated as desired. With collective reference to FIGS. 1-2, it can be appreciated that the relay 208 can be activated in response to a request 130 and/or other triggers that can indicate to the vehicle diagnostic system 102 that a battery test is desired. Thus, although not shown in FIG. 2, it should be understood that the vehicle diagnostic system 102 and/or the vehicle battery data analysis service 124 can issue a command or request that can trigger activation of the relay 208 of the load tester 116. It should be understood that this example is illustrative and therefore should not be construed as being limiting in any way.

Figure 3:
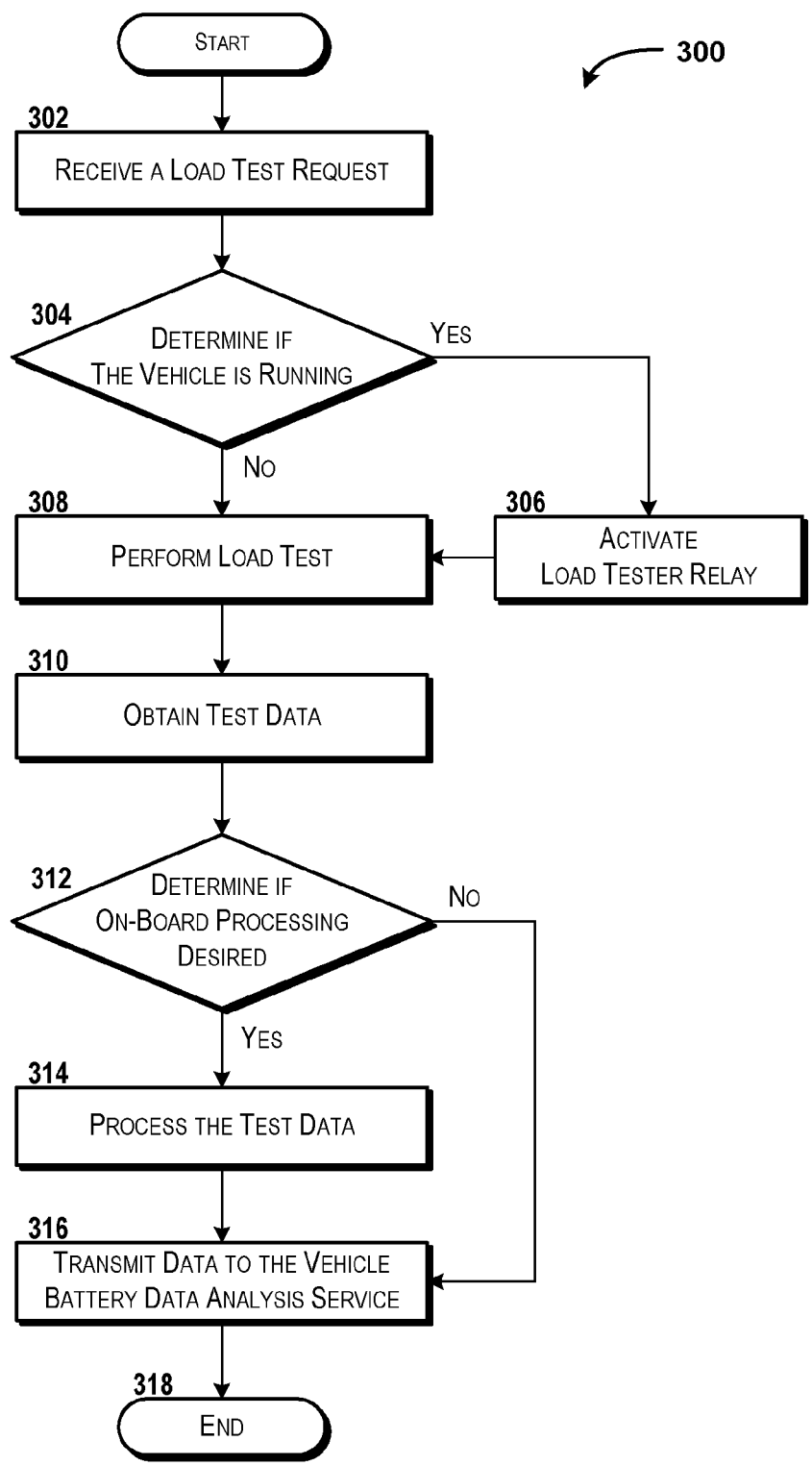
FIG. 3 is a flow diagram showing aspects of a method for performing a vehicle battery test, according to an illustrative embodiment of the concepts and technologies described herein.

Turning now to FIG. 3, aspects of a method 300 for performing a vehicle battery test will be described in detail, according to an illustrative embodiment. It should be understood that the operations of the methods disclosed herein are not necessarily presented in any particular order and that performance of some or all of the operations in an alternative order(s) is possible and is contemplated. The operations have been presented in the demonstrated order for ease of description and illustration. Operations may be added, omitted, and/or performed simultaneously, without departing from the scope of the concepts and technologies disclosed herein.

It also should be understood that the methods disclosed herein can be ended at any time and need not be performed in its entirety. Some or all operations of the methods, and/or substantially equivalent operations, can be performed by execution of computer-readable instructions included on a computer storage media, as defined herein. The term "computer-readable instructions," and variants thereof, as used herein, is used expansively to include routines, applications, application modules, program modules, programs, components, data structures, algorithms, and the like. Computer-readable instructions can be implemented on various system configurations including single-processor or multiprocessor systems, minicomputers, mainframe computers, personal computers, hand-held computing devices, microprocessor-based, programmable consumer electronics, combinations thereof, and the like.

Thus, it should be appreciated that the logical operations described herein are implemented (1) as a sequence of computer implemented acts or program modules running on a computing system and/or (2) as interconnected machine logic circuits or circuit modules within the computing system. The implementation is a matter of choice dependent on the performance and other requirements of the computing system. Accordingly, the logical operations described herein are referred to variously as states, operations, structural devices, acts, or modules. These states, operations, structural devices, acts, and modules may be implemented in software, in firmware, in special purpose digital logic, and any combination thereof. As used herein, the phrase "cause a processor to perform operations" and variants thereof is used to refer to causing a processor of a computing system or device, such as, the vehicle diagnostic system 102 or the server computer 126 to perform one or more operations and/or causing the processor to direct other components of the computing system or device to perform one or more of the operations.

For purposes of illustrating and describing the concepts of the present disclosure, the method 300 is described as being performed by the vehicle diagnostic system 102 via execution of one or more software modules such as, for example, the diagnostics application 108. It should be understood that additional and/or alternative devices and/or network nodes can provide the functionality described herein via execution of one or more modules, applications, and/or other software including, but not limited to, the diagnostics application 108. Thus, the illustrated embodiments are illustrative, and should not be viewed as being limiting in any way.

The method 300 begins at operation 302. At operation 302, the vehicle diagnostic system 102 can receive a load test request. According to various embodiments, the request received in operation 302 can correspond to a request 130 as illustrated and described above with reference to FIG. 1. Additionally, or alternatively, the request received in operation 302 can correspond to an implicit request such as a passage of a particular time, execution of a software command, or other event that can trigger the vehicle diagnostic system 102 to test the battery 120 as illustrated and described herein. Thus, it should be appreciated that the request received in operation 302 can correspond to an explicit request or an implicit request.

From operation 302, the method 300 proceeds to operation 304. At operation 304, the vehicle diagnostic system 102 can determine if the vehicle 112 is running. The vehicle diagnostic system 102 can determine the vehicle 112 is running, for example, by obtaining a signal from one or more vehicle sensors 118 such as, for example, an ignition sensor, a speedometer, a tachometer, a GPS receiver, or other device that can emit a signal or data that can be interpreted by the vehicle diagnostic system 102 to determine that the vehicle 112 is running.

If the vehicle diagnostic system 102 determines, in operation 304, that the vehicle 112 is running, the method 300 can proceed to operation 306. In operation 306, the vehicle diagnostic system 102 can activate a relay 208 of a load tester 116. As shown in FIG. 2, activation of the relay 208 can modify a circuit that includes the battery 120 to include a load sensor 212 and to remove from the circuit the alternator 200. It should be understood that the activation of the relay 208 can instead modify the circuit to include the alternator 200 (wherein deactivation of the relay 208 can remove the load sensor 212). As such, the illustrated and described embodiment should be understood as being illustrative and should not be construed as being limiting in any way.

From operation 306, the method 300 can proceed to operation 308. The method 300 also can proceed to operation 308 from operation 304 if the vehicle diagnostic system 102 determines, in operation 304, that the vehicle 112 is not running. In operation 308, the vehicle diagnostic system 102 can perform a load test. As illustrated and described above with reference to FIGS. 1-2, the vehicle diagnostic system 102 can obtain a measured load using a load sensor 212. It should be understood that other sensors or devices can measure the load as illustrated and described herein. Furthermore, it can be appreciated that if the vehicle 112 is not running, the relay 208 may not need to be activated or deactivated. It should be understood that this example is illustrative and therefore should not be construed as being limiting in any way.

As illustrated and described above with reference to FIG. 2, the load can be output by the load tester 116 via a data output 214 or the like. Furthermore, the data output 214 can obtain a battery identifier 216, if desired, and output the battery identifier 216 and the load to the data output 214. It should be understood that the vehicle diagnostic system 102 can also activate the receiver 218, in some embodiments, to receive the battery identifier 216 if desired. It should be understood that this example is illustrative and therefore should not be construed as being limiting in any way.

From operation 308, the method 300 proceeds to operation 310. At operation 310, the vehicle diagnostic system 102 can obtain test data 110 from the load tester 116. As discussed above, the load tester 116 can output a measured load and/or a battery identifier 216 via the data output 214, and the vehicle diagnostic system 102 can obtain that information as the test data 110. Thus, operation 310 can correspond to receiving the test data 110 at the vehicle diagnostic system 102 as output from the load test. It should be understood that this example is illustrative and therefore should not be construed as being limiting in any way.

From operation 310, the method 300 can proceed to operation 312. At operation 312, the vehicle diagnostic system 102 can determine if on-board processing of the test data 110 obtained in operation 310 is desired. According to various embodiments, the vehicle diagnostic system 102 can be configured to obtain the test data 110 and to package the test data 110 with other information such as, for example, location data, environmental data, other data, or the like. Thus, the vehicle diagnostic system 102 can obtain data or other information from various entities and package the test data 110 with those or other data. The packaged data is illustrated and described herein as the diagnostic data 122. It should be understood that this example is illustrative and therefore should not be construed as being limiting in any way.

The vehicle diagnostic system 102 can determine that the test data 110 is to be processed if the vehicle diagnostic system 102 determines that other information is to be provided with the test data 110. Thus, in operation 312, the vehicle diagnostic system 102 can determine if environmental data, location data, or other data or information is available and/or is to be provided with the test data 110. Because other processing on the test data 110 is possible and is contemplated (e.g., format changes, encoding/decoding, etc.), it should be understood that the determination in operation 312 can include additional and/or alternative determinations.

If the vehicle diagnostic system 102 determines, in operation 312, that on-board processing is to be performed on the data obtained in operation 310, the method 300 can proceed to operation 314. At operation 314, the vehicle diagnostic system 102 can process the test data 110. As explained above, the test data 110 can be processed by way of formatting changes, encoding, supplementation with other data, and/or packaging the test data 110 as, or as part of, the diagnostic data 122 illustrated and described herein. Because other data processing operations are possible and are contemplated, it should be understood that these examples are illustrative and therefore should not be construed as being limiting in any way.

If the vehicle diagnostic system 102 determines, in operation 312, that the test data 110 is not to be processed, the method 300 can proceed to operation 316. The method 300 also can proceed to operation 316 from operation 314. At operation 316, the vehicle diagnostic system 102 can transmit data to the vehicle battery data analysis service 124. It can be appreciated that the data transmitted in operation 316 can correspond to the test data 110 and/or the diagnostic data 122.

In particular, if the vehicle diagnostic system 102 does not process or package the test data 110 or otherwise supplement the test data 110, operation 316 can correspond to transmitting the test data 110 to the vehicle battery data analysis service 124, in which case the test data 110 can correspond to the diagnostic data 122. In various other embodiments, as illustrated and described above, the test data 110 can be packaged by the vehicle diagnostic system 102 and/or supplemented by the vehicle diagnostic system 102 with other data to create the diagnostic data 122. In either case, operation 316 can correspond to the vehicle diagnostic system 102 transmitting the diagnostic data 122 to the vehicle battery data analysis service 124 as shown in FIG. 1. It should be understood that this example is illustrative and therefore should not be construed as being limiting in any way.

From operation 316, the method 300 proceeds to operation 318. The method 300 ends at operation 318.

Figure 4:
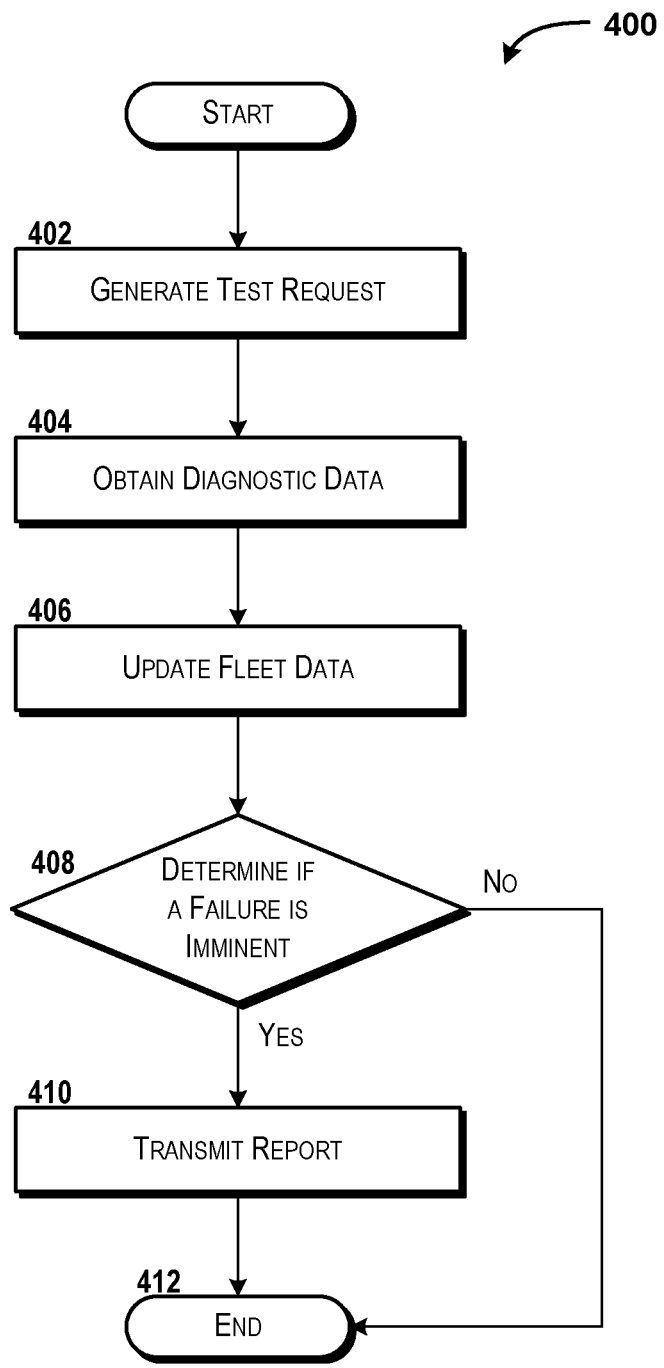
FIG. 4 is a flow diagram showing aspects of a method for analyzing diagnostic data at a vehicle battery data analysis service, according to an illustrative embodiment of the concepts and technologies described herein.

Turning now to FIG. 4, aspects of a method 400 for analyzing diagnostic data at a vehicle battery data analysis service 124 will be described in detail, according to an illustrative embodiment. For purposes of illustrating and describing the concepts of the present disclosure, the method 400 is described as being performed by the server computer 126 via execution of one or more software modules such as, for example, the vehicle battery data analysis service 124. It should be understood that additional and/or alternative devices and/or network nodes can provide the functionality described herein via execution of one or more modules, applications, and/or other software including, but not limited to, the vehicle battery data analysis service 124. Thus, the illustrated embodiments are illustrative, and should not be viewed as being limiting in any way.

The method 400 begins at operation 402. At operation 402, the server computer 126 can generate a test request. According to some embodiments, the server computer 126 can generate the test request in operation 402 by transmitting a request 130 to the vehicle diagnostic system 102 as illustrated and described in FIG. 1. In some other embodiments, the server computer 126 can generate the request by communicating with the vehicle diagnostic system 102 in other manners. For example, the diagnostics application 108 can communicate with the vehicle battery data analysis service 124 hosted or executed by the server computer 126 and, based upon interactions with the vehicle battery data analysis service 124, determine that a load test is to be performed on a battery 120.

In other embodiments, the server computer 126 can issue a command to the vehicle diagnostic system 102 to periodically perform a test (e.g., after expiration of a counter, for example). Because the server computer 126 can request or trigger a load test in additional and/or alternative ways, it should be understood that the illustrated embodiment of generating a test request is merely illustrative of one example of triggering the load test and therefore should not be construed as being limiting in any way.

From operation 402, the method 400 proceeds to operation 404. At operation 404, the server computer 126 can obtain diagnostic data 122 from the vehicle diagnostic system 102. Based upon the method 300 illustrated and described above with reference to FIG. 3, it can be appreciated that the method 300 can be executed by the vehicle diagnostic system 102 and that the diagnostic data 122 transmitted in operation 316 of the method 300 can be received by the server computer 126 in operation 404 of the method 400.

It should be understood that the diagnostic data 122 can be received by the server computer 126 in additional or other ways as explained above such as, for example, downloading the diagnostic data 122, receiving the diagnostic data 122 without generating a request for a test, and/or other manners. As such, it should be understood that the example embodiment illustrated and described in FIG. 4 is illustrative and therefore should not be construed as being limiting in any way.

From operation 404, the method 400 proceeds to operation 406. At operation 406, the server computer 126 can update the fleet data 132. The server computer 126 can update the fleet data 132 to reflect performance of the battery 120. The server computer 126 can perform various algorithms and/or processes on the diagnostic data 122 to generate or update the fleet data 132 in operation 406. For example, the server computer 126 can analyze the diagnostic data 122 and determine, based upon the analysis of the diagnostic data 122 and/or the fleet data 132, how the battery 120 is performing and/or how performance of the battery 120 is degrading over time.

If the server computer 126 detects a pattern in the diagnostic data 122 and/or the fleet data 132, the server computer 126 can generate an understanding of how the battery 120 is performing and/or can determine an anticipated life of the battery 120 and/or an anticipated time-to-failure of the battery 120. For example, the server computer 126 may trigger a test of the battery 120 over a period of time and determine, based upon diagnostic data 122 submitted during those tests, how quickly (if at all) performance of the battery 120 is deteriorating.

Similarly, the server computer 126 can determine, based upon an analysis of multiple iterations of the diagnostic data 122 and/or the fleet data 132, how various conditions affect performance of the battery 120. Because the load tester 116 can be configured to isolate the battery 120 from the alternator 200 and/or other electrical systems of the vehicle 112, even when the vehicle is running, the server computer 126 can determine, based upon the diagnostic data 122, how the battery 120 performs under a load; at a split second before starting of the vehicle 112; at particular geographic locations; at specific environmental conditions such as temperature, air pressure, humidity, or the like; at particular times of day; at particular engine temperatures and/or running times (or elapsing of particular times between running); combinations thereof; or the like.

As such, the server computer 126 can be configured to analyze the diagnostic data 122 and the fleet data 132 to detect and quantify trends among vehicles 112, batteries 120, locations 128, ambient conditions, battery ages, combinations thereof, or the like. Thus, the server computer 126 can determine that a battery 120 of a certain age will have an anticipated life of X; that the battery 120 will likely fail given specific ambient conditions; that the battery 120 will not fail given specific ambient conditions; the likelihood that the battery 120 will fail or will not fail given particular locations, operating conditions, loads, environmental conditions, combinations thereof, or the like.

Thus, it can be appreciated that the server computer 126 can analyze the fleet data 132 and/or multiple iterations of the diagnostic data 122 to detect trends in battery performance as well as to predict failures of a particular battery 120. Because the trends and/or predicted failures can be determined in additional and/or alternative ways, it should be understood that these examples are illustrative and therefore should not be construed as being limiting in any way.

From operation 406, the method 400 proceeds to operation 408. At operation 408, the server computer 126 can determine if a failure of the battery 120 is imminent. It can be appreciated from the description of operation 406 that the server computer 126 can detect a pending failure based upon trends or histories of the battery 120 itself and/or based upon performance of other batteries 120 as reflected by the fleet data 132 and/or execution of algorithms thereon. It should be understood that these examples are illustrative and therefore should not be construed as being limiting in any way.

If the server computer 126 determines, in operation 408, that a failure is imminent, the method 400 can proceed to operation 410. At operation 410, the server computer 126 can generate and transmit a report 136 to a fleet management entity 138. The report 136 can identify a vehicle 112 and indicate that the battery 120 associated with the vehicle 112 is likely to fail soon. Although not shown in FIG. 4, the fleet management entity 138 can be configured to schedule a repair and/or transmit a command to the vehicle 112, wherein the command can indicate that the vehicle 112 should be repaired to prevent failure of the battery 120. Because other actions can be taken in response to determining that a failure of the battery 120 is imminent, it should be understood that the above example is illustrative and should not be construed as being limiting in any way.

From operation 410, the method 400 proceeds to operation 412. The method 400 also can proceed to operation 412 from operation 408, if the server computer 126 determines, in operation 408, that the failure is not imminent. The method 400 ends at operation 412.

Figure 5:
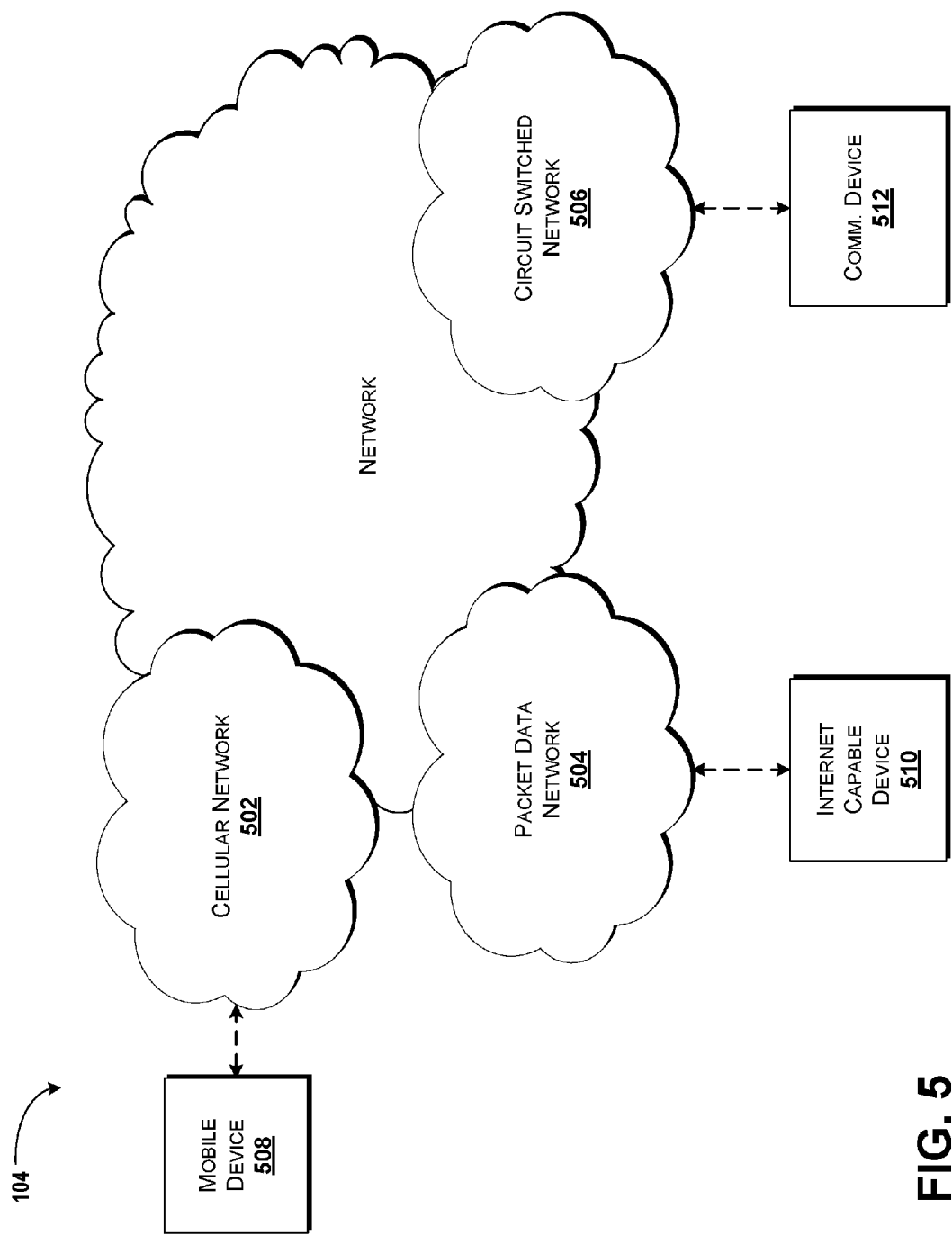
FIG. 5 schematically illustrates a network, according to an illustrative embodiment of the concepts and technologies described herein.

Turning now to FIG. 5, additional details of the network 104 are illustrated, according to an illustrative embodiment. The network 104 includes a cellular network 502, a packet data network 504, for example, the Internet, and a circuit switched network 506, for example, a publicly switched telephone network ("PSTN"). The cellular network 502 includes various components such as, but not limited to, base transceiver stations ("BTSs"), Node-B's or e-Node-B's, base station controllers ("BSCs"), radio network controllers ("RNCs"), mobile switching centers ("MSCs"), mobile management entities ("MMEs"), short message service centers ("SMSCs"), multimedia messaging service centers ("MMSCs"), home location registers ("HLRs"), home subscriber servers ("HSSs"), visitor location registers ("VLRs"), charging platforms, billing platforms, voicemail platforms, GPRS core network components, location service nodes, an IP Multimedia Subsystem ("IMS"), and the like. The cellular network 502 also includes radios and nodes for receiving and transmitting voice, data, and combinations thereof to and from radio transceivers, networks, the packet data network 504, and the circuit switched network 506.

A mobile communications device 508, such as, for example, a cellular telephone, a user equipment, a mobile terminal, a PDA, a laptop computer, a handheld computer, and combinations thereof, can be operatively connected to the cellular network 502. The cellular network 502 can be configured as a 2G GSM network and can provide data communications via GPRS and/or EDGE. Additionally, or alternatively, the cellular network 502 can be configured as a 3G UMTS network and can provide data communications via the HSPA protocol family, for example, HSDPA, EUL (also referred to as HSDPA), and HSPA+. The cellular network 502 also is compatible with 4G mobile communications standards as well as evolved and future mobile standards.

The packet data network 504 includes various devices, for example, servers, computers, databases, and other devices in communication with one another, as is generally known. The packet data network 504 devices are accessible via one or more network links. The servers often store various files that are provided to a requesting device such as, for example, a computer, a terminal, a smartphone, or the like. Typically, the requesting device includes software (a "browser") for executing a web page in a format readable by the browser or other software. Other files and/or data may be accessible via "links" in the retrieved files, as is generally known. In some embodiments, the packet data network 504 includes or is in communication with the Internet. The circuit switched network 506 includes various hardware and software for providing circuit switched communications. The circuit switched network 506 may include, or may be, what is often referred to as a plain old telephone system (POTS). The functionality of a circuit switched network 506 or other circuit-switched network are generally known and will not be described herein in detail.

The illustrated cellular network 502 is shown in communication with the packet data network 504 and a circuit switched network 506, though it should be appreciated that this is not necessarily the case. One or more Internet-capable devices 510, for example, a PC, a laptop, a portable device, or another suitable device, can communicate with one or more cellular networks 502, and devices connected thereto, through the packet data network 504. It also should be appreciated that the Internet-capable device 510 can communicate with the packet data network 504 through the circuit switched network 506, the cellular network 502, and/or via other networks (not illustrated).

As illustrated, a communications device 512, for example, a telephone, facsimile machine, modem, computer, or the like, can be in communication with the circuit switched network 506, and therethrough to the packet data network 504 and/or the cellular network 502. It should be appreciated that the communications device 512 can be an Internet-capable device, and can be substantially similar to the Internet-capable device 510. In the specification, the network 104 is used to refer broadly to any combination of the networks 502, 504, 506. It should be appreciated that substantially all of the functionality described with reference to the network 104 can be performed by the cellular network 502, the packet data network 504, and/or the circuit switched network 506, alone or in combination with other networks, network elements, and the like.

According to various implementations, the vehicle diagnostic system 102 and/or the server computer 126 can use any combination of the devices disclosed herein including, but not limited to, the mobile communications device 508, the Internet-capable device 510, and/or the communications device 512 to communicate with other devices, to transmit and/or receive the diagnostic data 122, to transmit and/or receive the requests 130, to transmit the reports 136, and/or for other interactions between the vehicle diagnostic system 102 and the server computer 126. As such, it should be understood that the vehicle diagnostic system 102 and the server computer 126 can interact with one another via any number and/or combination of devices and networks.

Figure 6:
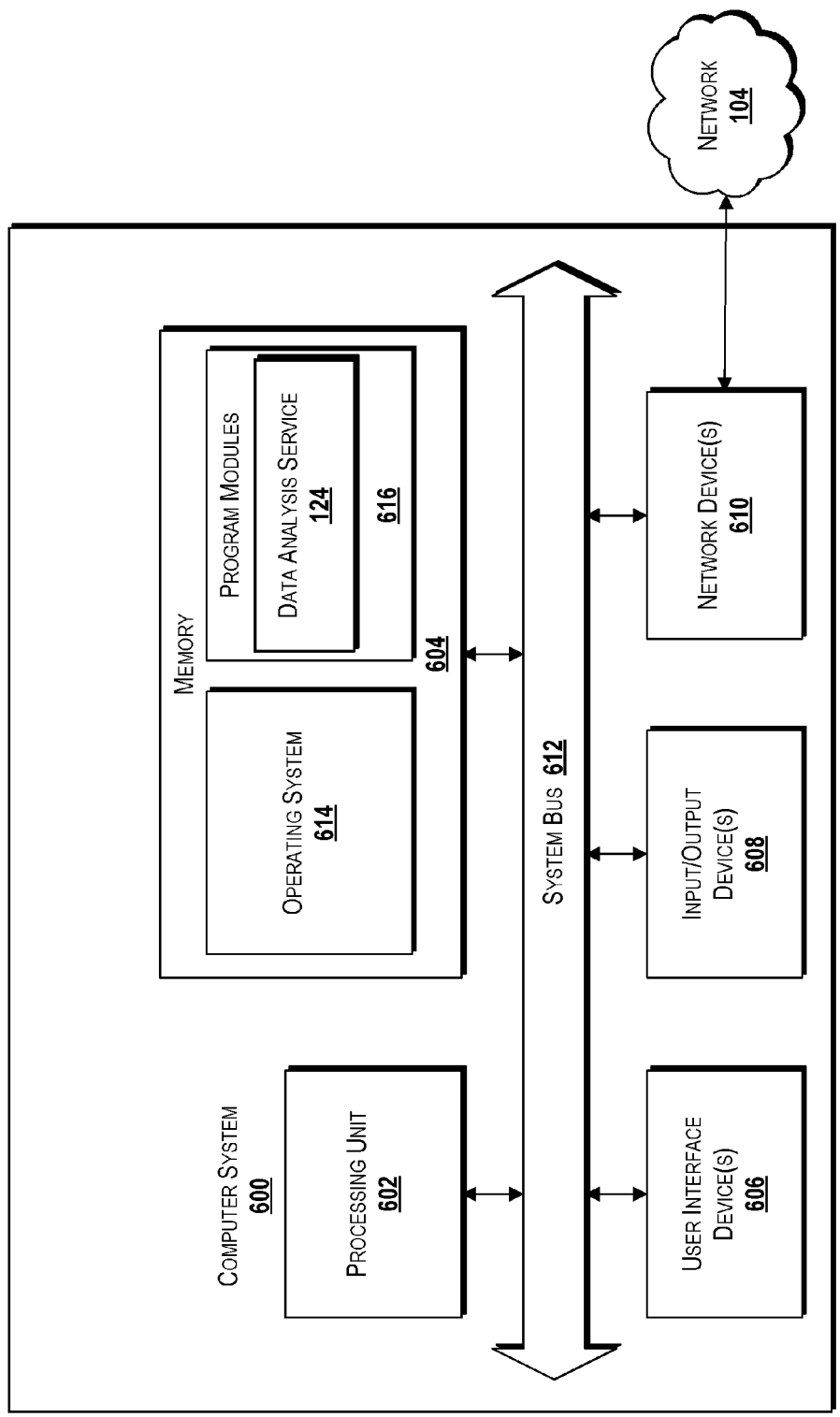
FIG. 6 is a block diagram illustrating an example computer system configured to provide a vehicle battery data analysis service, according to some illustrative embodiments of the concepts and technologies described herein.

FIG. 6 is a block diagram illustrating a computer system 600 configured to provide the functionality described herein for providing and/or interacting with a vehicle battery data analysis service 124, in accordance with various embodiments of the concepts and technologies disclosed herein. The computer system 600 includes a processing unit 602, a memory 604, one or more user interface devices 606, one or more input/output ("I/O") devices 608, and one or more network devices 610, each of which is operatively connected to a system bus 612. The bus 612 enables bi-directional communication between the processing unit 602, the memory 604, the user interface devices 606, the I/O devices 608, and the network devices 610.

The processing unit 602 may be a standard central processor that performs arithmetic and logical operations, a more specific purpose programmable logic controller ("PLC"), a programmable gate array, or other type of processor known to those skilled in the art and suitable for controlling the operation of the server computer. As used herein, the word "processor" and/or the phrase "processing unit" when used with regard to any architecture or system can include multiple processors or processing units distributed across and/or operating in parallel in a single machine or in multiple machines. Furthermore, processors and/or processing units can be used to support virtual processing environments. Processors and processing units also can include state machines, application-specific integrated circuits ("ASICs"), combinations thereof, or the like. Because processors and/or processing units are generally known, the processors and processing units disclosed herein will not be described in further detail herein.

The memory 604 communicates with the processing unit 602 via the system bus 612. In some embodiments, the memory 604 is operatively connected to a memory controller (not shown) that enables communication with the processing unit 602 via the system bus 612. The memory 604 includes an operating system 614 and one or more program modules 616. The operating system 614 can include, but is not limited to, members of the WINDOWS, WINDOWS CE, and/or WINDOWS MOBILE families of operating systems from MICROSOFT CORPORATION, the LINUX family of operating systems, the SYMBIAN family of operating systems from SYMBIAN LIMITED, the BREW family of operating systems from QUALCOMM CORPORATION, the MAC OS, iOS, and/or LEOPARD families of operating systems from APPLE CORPORATION, the FREEBSD family of operating systems, the SOLARIS family of operating systems from ORACLE CORPORATION, other operating systems, and the like.

The program modules 616 may include various software and/or program modules described herein. In some embodiments, for example, the program modules 616 include the diagnostics application 108, the vehicle battery data analysis service 124, or other program modules. This and/or other programs can be embodied in computer-readable media containing instructions that, when executed by the processing unit 602, perform one or more of the methods 300, 400 described in detail above with respect to FIGS. 3-4. According to embodiments, the program modules 616 may be embodied in hardware, software, firmware, or any combination thereof. Although not shown in FIG. 6, it should be understood that the memory 604 also can be configured to store the test data 110, the diagnostic data 122, the fleet data 132, the reports 136, or other information or data, if desired.

By way of example, and not limitation, computer-readable media may include any available computer storage media or communication media that can be accessed by the computer system 600. Communication media includes computer-readable instructions, data structures, program modules, or other data in a modulated data signal such as a carrier wave or other transport mechanism and includes any delivery media. The term "modulated data signal" means a signal that has one or more of its characteristics changed or set in a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

Computer storage media includes volatile and non-volatile, removable and non-removable media implemented in any method or technology for storage of information such as computer-readable instructions, data structures, program modules, or other data. Computer storage media includes, but is not limited to, RAM, ROM, Erasable Programmable ROM ("EPROM"), Electrically Erasable Programmable ROM ("EEPROM"), flash memory or other solid state memory technology, CD-ROM, digital versatile disks ("DVD"), or other optical storage, magnetic cassettes, magnetic tape, magnetic disk storage or other magnetic storage devices, or any other medium which can be used to store the desired information and which can be accessed by the computer system 600. In the claims, the phrase "computer storage medium" and variations thereof does not include waves or signals per se and/or communication media.

The user interface devices 606 may include one or more devices with which a user accesses the computer system 600. The user interface devices 606 may include, but are not limited to, computers, servers, personal digital assistants, cellular phones, or any suitable computing devices. The I/O devices 608 enable a user to interface with the program modules 616. In one embodiment, the I/O devices 608 are operatively connected to an I/O controller (not shown) that enables communication with the processing unit 602 via the system bus 612. The I/O devices 608 may include one or more input devices, such as, but not limited to, a keyboard, a mouse, or an electronic stylus. Further, the I/O devices 608 may include one or more output devices, such as, but not limited to, a display screen or a printer.

The network devices 610 enable the computer system 600 to communicate with other networks or remote systems via a network, such as the network 104. Examples of the network devices 610 include, but are not limited to, a modem, a radio frequency ("RF") or infrared ("IR") transceiver, a telephonic interface, a bridge, a router, or a network card. The network 104 may include a wireless network such as, but not limited to, a Wireless Local Area Network ("WLAN") such as a WI-FI network, a Wireless Wide Area Network ("WWAN"), a Wireless Personal Area Network ("WPAN") such as BLUETOOTH, a Wireless Metropolitan Area Network ("WMAN") such a WiMAX network, or a cellular network. Alternatively, the network 104 may be a wired network such as, but not limited to, a Wide Area Network ("WAN") such as the Internet, a Local Area Network ("LAN") such as the Ethernet, a wired Personal Area Network ("PAN"), or a wired Metropolitan Area Network ("MAN").

Figure 7:
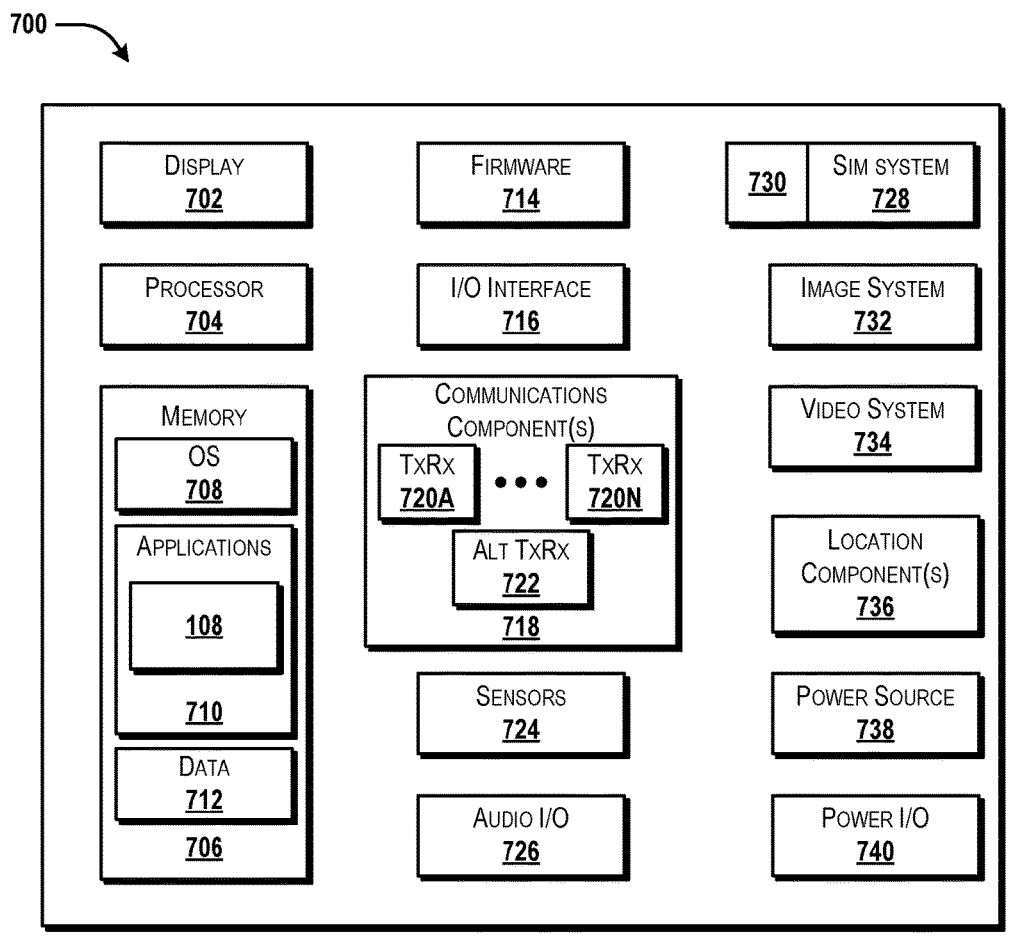
FIG. 7 is a block diagram illustrating an example mobile device configured to interact with a load tester and a vehicle battery data analysis service, according to some illustrative embodiments of the concepts and technologies described herein.

Turning now to FIG. 7, an illustrative mobile device 700 and components thereof will be described. In some embodiments, one or more of the vehicle diagnostic system 102 and/or the server computer 126 described above with reference to FIGS. 1-6 can be configured as and/or can have an architecture similar or identical to the mobile device 700 described herein in FIG. 7. It should be understood, however, that one or more of the vehicle diagnostic system 102 and/or the server computer 126 may or may not include the functionality described herein with reference to FIG. 7. While connections are not shown between the various components illustrated in FIG. 7, it should be understood that some, none, or all of the components illustrated in FIG. 7 can be configured to interact with one other to carry out various device functions. In some embodiments, the components are arranged so as to communicate via one or more busses (not shown). Thus, it should be understood that FIG. 7 and the following description are intended to provide a general understanding of a suitable environment in which various aspects of embodiments can be implemented, and should not be construed as being limiting in any way.

As illustrated in FIG. 7, the mobile device 700 can include a display 702 for displaying data. According to various embodiments, the display 702 can be configured to display various graphical user interface ("GUI") elements for text, images, video, virtual keypads and/or keyboards, messaging data, notification messages, metadata, internet content, device status, time, date, calendar data, device preferences, map and location data, combinations thereof, and/or the like.

The mobile device 700 also can include a processor 704 and a memory or other data storage device ("memory") 706. The processor 704 can be configured to process data and/or can execute computer-executable instructions stored in the memory 706. The computer-executable instructions executed by the processor 704 can include, for example, an operating system 708, one or more applications 710 such as the diagnostics application 108, the vehicle battery data analysis service 124, other computer-executable instructions stored in a memory 706, or the like. In some embodiments, the applications 710 also can include a UI application (not illustrated in FIG. 7).

The UI application can interface with the operating system 708, such as the operating system 106 shown in FIG. 1, to facilitate user interaction with functionality and/or data stored at the mobile device 700 and/or stored elsewhere. In some embodiments, the operating system 708 can include a member of the SYMBIAN OS family of operating systems from SYMBIAN LIMITED, a member of the WINDOWS MOBILE OS and/or WINDOWS PHONE OS families of operating systems from MICROSOFT CORPORATION, a member of the PALM WEBOS family of operating systems from HEWLETT PACKARD CORPORATION, a member of the BLACKBERRY OS family of operating systems from RESEARCH IN MOTION LIMITED, a member of the IOS family of operating systems from APPLE INC., a member of the ANDROID OS family of operating systems from GOOGLE INC., and/or other operating systems. These operating systems are merely illustrative of some contemplated operating systems that may be used in accordance with various embodiments of the concepts and technologies described herein and therefore should not be construed as being limiting in any way.

The UI application can be executed by the processor 704 to aid a user in entering content, allowing a user to request a load test or view load test results, configuring settings, manipulating address book content and/or settings, multimode interaction, interacting with other applications 710, and otherwise facilitating user interaction with the operating system 708, the applications 710, and/or other types or instances of data 712 that can be stored at the mobile device 700. The data 712 can include, for example, the diagnostics application 108, the vehicle battery data analysis service 124, and/or other applications or program modules.

According to various embodiments, the data 712 can include, for example, presence applications, visual voice mail applications, messaging applications, text-to-speech and speech-to-text applications, add-ons, plug-ins, email applications, music applications, video applications, camera applications, location-based service applications, power conservation applications, game applications, productivity applications, entertainment applications, enterprise applications, combinations thereof, and the like. The applications 710, the data 712, and/or portions thereof can be stored in the memory 706 and/or in a firmware 714, and can be executed by the processor 704. The firmware 714 also can store code for execution during device power up and power down operations. It can be appreciated that the firmware 714 can be stored in a volatile or non-volatile data storage device including, but not limited to, the memory 706 and/or a portion thereof.

The mobile device 700 also can include an input/output ("I/O") interface 716. The I/O interface 716 can be configured to support the input/output of data such as location information, the test data 110, the diagnostic data 122, the fleet data 132, user or vehicle information, organization information, presence status information, user IDs, passwords, and application initiation (start-up) requests. In some embodiments, the I/O interface 716 can include a hardwire connection such as a universal serial bus ("USB") port, a mini-USB port, a micro-USB port, an audio jack, a PS2 port, an IEEE 1394 ("FIREWIRE") port, a serial port, a parallel port, an Ethernet (RJ45) port, an RJ11 port, a proprietary port, combinations thereof, or the like. In some embodiments, the mobile device 700 can be configured to synchronize with another device to transfer content to and/or from the mobile device 700. In some embodiments, the mobile device 700 can be configured to receive updates to one or more of the applications 710 via the I/O interface 716, though this is not necessarily the case. In some embodiments, the I/O interface 716 accepts I/O devices such as keyboards, keypads, mice, interface tethers, printers, plotters, external storage, touch/multi-touch screens, touch pads, trackballs, joysticks, microphones, remote control devices, displays, projectors, medical equipment (e.g., stethoscopes, heart monitors, and other health metric monitors), modems, routers, external power sources, docking stations, combinations thereof, and the like. It should be appreciated that the I/O interface 716 may be used for communications between the mobile device 700 and a network device or local device.

The mobile device 700 also can include a communications component 718. The communications component 718 can be configured to interface with the processor 704 to facilitate wired and/or wireless communications with one or more networks such as the network 104 described herein. In some embodiments, other networks include networks that utilize non-cellular wireless technologies such as WI-FI or WIMAX. In some embodiments, the communications component 718 includes a multimode communications subsystem for facilitating communications via the cellular network and one or more other networks.

The communications component 718, in some embodiments, includes one or more transceivers. The one or more transceivers, if included, can be configured to communicate over the same and/or different wireless technology standards with respect to one another. For example, in some embodiments one or more of the transceivers of the communications component 718 may be configured to communicate using GSM, CDMAONE, CDMA2000, LTE, and various other 2G, 2.5G, 3G, 4G, and greater generation technology standards. Moreover, the communications component 718 may facilitate communications over various channel access methods (which may or may not be used by the aforementioned standards) including, but not limited to, TDMA, FDMA, W-CDMA, OFDM, SDMA, and the like.

In addition, the communications component 718 may facilitate data communications using GPRS, EDGE, the HSPA protocol family including HSDPA, EUL or otherwise termed HSDPA, HSPA+, and various other current and future wireless data access standards. In the illustrated embodiment, the communications component 718 can include a first transceiver ("TxRx") 720A that can operate in a first communications mode (e.g., GSM). The communications component 718 also can include an $N^{th}$ transceiver ("TxRx") 720N that can operate in a second communications mode relative to the first transceiver 720A (e.g., UMTS). While two transceivers 720A-N (hereinafter collectively and/or generically referred to as "transceivers 720") are shown in FIG. 7, it should be appreciated that less than two, two, and/or more than two transceivers 720 can be included in the communications component 718.

The communications component 718 also can include an alternative transceiver ("Alt TxRx") 722 for supporting other types and/or standards of communications. According to various contemplated embodiments, the alternative transceiver 722 can communicate using various communications technologies such as, for example, WI-FI, WIMAX, BLUETOOTH, infrared, infrared data association ("IRDA"), near field communications ("NFC"), other RF technologies, combinations thereof, and the like. In some embodiments, the communications component 718 also can facilitate reception from terrestrial radio networks, digital satellite radio networks, internet-based radio service networks, combinations thereof, and the like. The communications component 718 can process data from a network such as the Internet, an intranet, a broadband network, a WI-FI hotspot, an Internet service provider ("ISP"), a digital subscriber line ("DSL") provider, a broadband provider, combinations thereof, or the like.

The mobile device 700 also can include one or more sensors 724. The sensors 724 can include temperature sensors, light sensors, air quality sensors, movement sensors, orientation sensors, noise sensors, proximity sensors, or the like. As such, it should be understood that the sensors 724 can include, but are not limited to, accelerometers, magnetometers, gyroscopes, infrared sensors, noise sensors, microphones, combinations thereof, or the like. Additionally, audio capabilities for the mobile device 700 may be provided by an audio I/O component 726. The audio I/O component 726 of the mobile device 700 can include one or more speakers for the output of audio signals, one or more microphones for the collection and/or input of audio signals, and/or other audio input and/or output devices.

The illustrated mobile device 700 also can include a subscriber identity module ("SIM") system 728. The SIM system 728 can include a universal SIM ("USIM"), a universal integrated circuit card ("UICC") and/or other identity devices. The SIM system 728 can include and/or can be connected to or inserted into an interface such as a slot interface 730. In some embodiments, the slot interface 730 can be configured to accept insertion of other identity cards or modules for accessing various types of networks. Additionally, or alternatively, the slot interface 730 can be configured to accept multiple subscriber identity cards. Because other devices and/or modules for identifying users and/or the mobile device 700 are contemplated, it should be understood that these embodiments are illustrative, and should not be construed as being limiting in any way.

The mobile device 700 also can include an image capture and processing system 732 ("image system"). The image system 732 can be configured to capture or otherwise obtain photos, videos, and/or other visual information. As such, the image system 732 can include cameras, lenses, charge-coupled devices ("CCDs"), combinations thereof, or the like. The mobile device 700 may also include a video system 734. The video system 734 can be configured to capture, process, record, modify, and/or store video content. Photos and videos obtained using the image system 732 and the video system 734, respectively, may be added as message content to an MMS message, email message, and sent to another mobile device. The video and/or photo content also can be shared with other devices via various types of data transfers via wired and/or wireless communication devices as described herein.

The mobile device 700 also can include one or more location components 736. The location components 736 can be configured to send and/or receive signals to determine a geographic location of the mobile device 700. According to various embodiments, the location components 736 can send and/or receive signals from global positioning system ("GPS") devices, assisted-GPS ("A-GPS") devices, WI-FI/

WIMAX and/or cellular network triangulation data, combinations thereof, and the like. The location component 736 also can be configured to communicate with the communications component 718 to retrieve triangulation data for determining a location of the mobile device 700. In some embodiments, the location component 736 can interface with cellular network nodes, telephone lines, satellites, location transmitters and/or beacons, wireless network transmitters and receivers, combinations thereof, and the like. In some embodiments, the location component 736 can include and/or can communicate with one or more of the sensors 724 such as a compass, an accelerometer, and/or a gyroscope to determine the orientation of the mobile device 700. Using the location component 736, the mobile device 700 can generate and/or receive data to identify its geographic location, or to transmit data used by other devices to determine the location of the mobile device 700. The location component 736 may include multiple components for determining the location and/or orientation of the mobile device 700.

The illustrated mobile device 700 also can include a power source 738. The power source 738 can include one or more batteries, power supplies, power cells, and/or other power subsystems including alternating current ("AC") and/or direct current ("DC") power devices. The power source 738 also can interface with an external power system or charging equipment via a power I/O component 740. Because the mobile device 700 can include additional and/or alternative components, the above embodiment should be understood as being illustrative of one possible operating environment for various embodiments of the concepts and technologies described herein. The described embodiment of the mobile device 700 is illustrative, and should not be construed as being limiting in any way.

Based on the foregoing, it should be appreciated that systems and methods for providing and/or interacting with a vehicle battery data analysis service have been disclosed herein. Although the subject matter presented herein has been described in language specific to computer structural features, methodological and transformative acts, specific computing machinery, and computer-readable media, it is to be understood that the concepts and technologies disclosed herein are not necessarily limited to the specific features, acts, or media described herein. Rather, the specific features, acts and mediums are disclosed as example forms of implementing the concepts and technologies disclosed herein.

The subject matter described above is provided by way of illustration only and should not be construed as limiting. Various modifications and changes may be made to the subject matter described herein without following the example embodiments and applications illustrated and described, and without departing from the true spirit and scope of the embodiments of the concepts and technologies disclosed herein.

The invention claimed is:

1. A method comprising:
obtaining, by a processor that executes a vehicle battery data analysis service, diagnostic data generated by a vehicle diagnostic system that is located at a vehicle, the diagnostic data comprising test data that indicates a load of a battery of the vehicle and vehicle data that identifies the vehicle, wherein the test data is obtained by the vehicle diagnostic system from a load tester that is located at the vehicle, wherein the load tester performs a load test while the vehicle is running, and wherein the load tester comprises a relay that, when activated, disconnects a vehicle alternator from a sensor loop that comprises a load sensor to allow load testing of the battery while the vehicle is running.

2. The method of claim 1, wherein the diagnostic data further comprises location data that identifies a geographic location of the vehicle when the load test is performed.

3. The method of claim 2, wherein the diagnostic data further comprises environmental data that identifies ambient conditions at the geographic location.

4. The method of claim 1, further comprising:
determining that failure of the battery is imminent; and
transmitting, directed to a fleet management entity, a report that indicates that the failure is imminent.

5. The method of claim 1, further comprising:
determining that failure of the battery is imminent; and
transmitting a warning for presentation at the vehicle, wherein the warning comprises an instruction not to stop the vehicle until the vehicle has reached a particular location.

6. The method of claim 5, wherein the particular location is associated with a repair facility.

7. The method of claim 5, wherein the particular location is associated with a parking facility.

8. The method of claim 1, wherein the load sensor measures the load of the battery and provides a signal indicating the load measured to a data output.

9. The method of claim 1, further comprising:
in response to determining that failure of the battery is imminent, transmitting, to a fleet management entity, a report that indicates that the failure is imminent, wherein the fleet management entity orders a repair of the battery and indicates, to the vehicle diagnostic system, that the battery is expected to fail.

10. The method of claim 1, wherein the vehicle diagnostic system activates the relay.

11. A system comprising:
a processor; and
a memory that stores computer-executable instructions that, when executed by the processor, cause the processor to perform operations comprising
obtaining diagnostic data generated by a vehicle diagnostic system that is located at a vehicle, the diagnostic data comprising test data that indicates a load of a battery of the vehicle and vehicle data that identifies the vehicle, wherein the test data is obtained by the vehicle diagnostic system from a load tester that is located at the vehicle, wherein the load tester performs a load test while the vehicle is running, and wherein the load tester comprises a relay that, when activated, disconnects a vehicle alternator from a sensor loop that comprises a load sensor to allow load testing of the battery while the vehicle is running.

12. The system of claim 11, wherein the computer-executable instructions, when executed by the processor, cause the processor to perform operations further comprising:
determining that failure of the battery is imminent; and
transmitting, directed to a fleet management entity, a report that indicates that the failure is imminent.

13. The system of claim 11, wherein the computer-executable instructions, when executed by the processor, cause the processor to perform operations further comprising:
determining that failure of the battery is imminent; and transmitting a warning for presentation at the vehicle, wherein the warning comprises an instruction not to stop the vehicle until the vehicle has reached a particular location.

14. The system of claim 13, wherein the particular location is associated with a repair facility.

15. The system of claim 11, wherein the computer-executable instructions, when executed by the processor, cause the processor to perform operations further comprising:
in response to determining that failure of the battery is imminent, transmitting, to a fleet management entity, a report that indicates that the failure is imminent, wherein the fleet management entity orders a repair of the battery and indicates, to the vehicle diagnostic system, that the battery is expected to fail.

16. The system of claim 11, wherein the vehicle diagnostic system activates the relay.

17. A computer storage medium having computer-executable instructions stored thereon that, when executed by a processor, cause the processor to perform operations comprising:
obtaining diagnostic data generated by a vehicle diagnostic system that is located at a vehicle, the diagnostic data comprising test data that indicates a load of a battery of the vehicle and vehicle data that identifies the vehicle, wherein the test data is obtained by the vehicle diagnostic system from a load tester that is located at the vehicle, wherein the load tester performs a load test while the vehicle is running, and wherein the load tester comprises a relay that, when activated, disconnects a vehicle alternator from a sensor loop that comprises a load sensor to allow load testing of the battery while the vehicle is running.

18. The computer storage medium of claim 17, wherein the computer-executable instructions, when executed by the processor, cause the processor to perform operations further comprising:
determining that failure of the battery is imminent; and
transmitting a warning for presentation at the vehicle, wherein the warning comprises an instruction not to stop the vehicle until the vehicle has reached a particular location.

19. The computer storage medium of claim 18, wherein the particular location is associated with a repair facility.

20. The computer storage medium of claim 17, wherein the computer-executable instructions, when executed by the processor, cause the processor to perform operations further comprising:
determining that failure of the battery is imminent; and
transmitting, directed to a fleet management entity, a report that indicates that the failure is imminent.

* * * * *